United States Patent
Kim et al.

(10) Patent No.: US 11,930,660 B2
(45) Date of Patent: Mar. 12, 2024

(54) DISPLAY DEVICE AND A METHOD OF MANUFACTURING THE SAME

(71) Applicant: Samsung Display Co., LTD., Yongin-si (KR)

(72) Inventors: Boyun Kim, Cheonan-si (KR); Ji Hyuk Im, Yongin-si (KR); Eungil Choi, Cheonan-si (KR); Jiyun Jung, Seoul (KR); Sungwon Cho, Cheonan-si (KR); Inwook Cho, Uiwang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 350 days.

(21) Appl. No.: 17/483,718

(22) Filed: Sep. 23, 2021

(65) Prior Publication Data

US 2022/0093898 A1   Mar. 24, 2022

(30) Foreign Application Priority Data

Sep. 24, 2020 (KR) ......................... 10-2020-0123678

(51) Int. Cl.
*H10K 50/844* (2023.01)
*H10K 50/842* (2023.01)
*H10K 71/00* (2023.01)
*H10K 102/00* (2023.01)

(52) U.S. Cl.
CPC ....... *H10K 50/844* (2023.02); *H10K 50/8426* (2023.02); *H10K 71/00* (2023.02); *H10K 2102/311* (2023.02)

(58) Field of Classification Search
CPC .. H10K 50/844; H10K 50/8426; H10K 71/00; H10K 2102/311; H10K 59/87; H10K 77/111; H10K 59/12; H10K 50/841; G09F 9/301
See application file for complete search history.

(56) References Cited

U.S. PATENT DOCUMENTS

| | | | |
|---|---|---|---|
| 10,177,129 B2 | 1/2019 | Namkung et al. | |
| 10,631,408 B2 | 4/2020 | Koo et al. | |
| 2011/0210937 A1 | 9/2011 | Kee et al. | |
| 2019/0339741 A1* | 11/2019 | Park | H10K 50/125 |
| 2019/0373719 A1* | 12/2019 | Lee | H10K 59/40 |
| 2020/0133342 A1 | 4/2020 | Choi et al. | |
| 2021/0104594 A1* | 4/2021 | Liu | H10K 71/00 |
| 2022/0181581 A1* | 6/2022 | Kawamura | H10K 71/80 |

FOREIGN PATENT DOCUMENTS

| | | |
|---|---|---|
| KR | 101643377 | 7/2016 |
| KR | 1020180003716 | 1/2018 |
| KR | 1020190011994 | 2/2019 |
| KR | 1020200049942 | 5/2020 |
| KR | 1020200055481 | 5/2020 |

* cited by examiner

*Primary Examiner* — J. E. Schoenholtz
(74) *Attorney, Agent, or Firm* — H.C. Park & Associates, PLC

(57) ABSTRACT

A display device, includes: a display panel including a first area, a second area spaced apart from the first area, and a bendable area between the first area and the second area; a window disposed on the display panel overlapping the first area; a protective layer disposed on the window including a first portion overlapping the bendable area; and an adhesive disposed between the window and the protective layer.

20 Claims, 13 Drawing Sheets

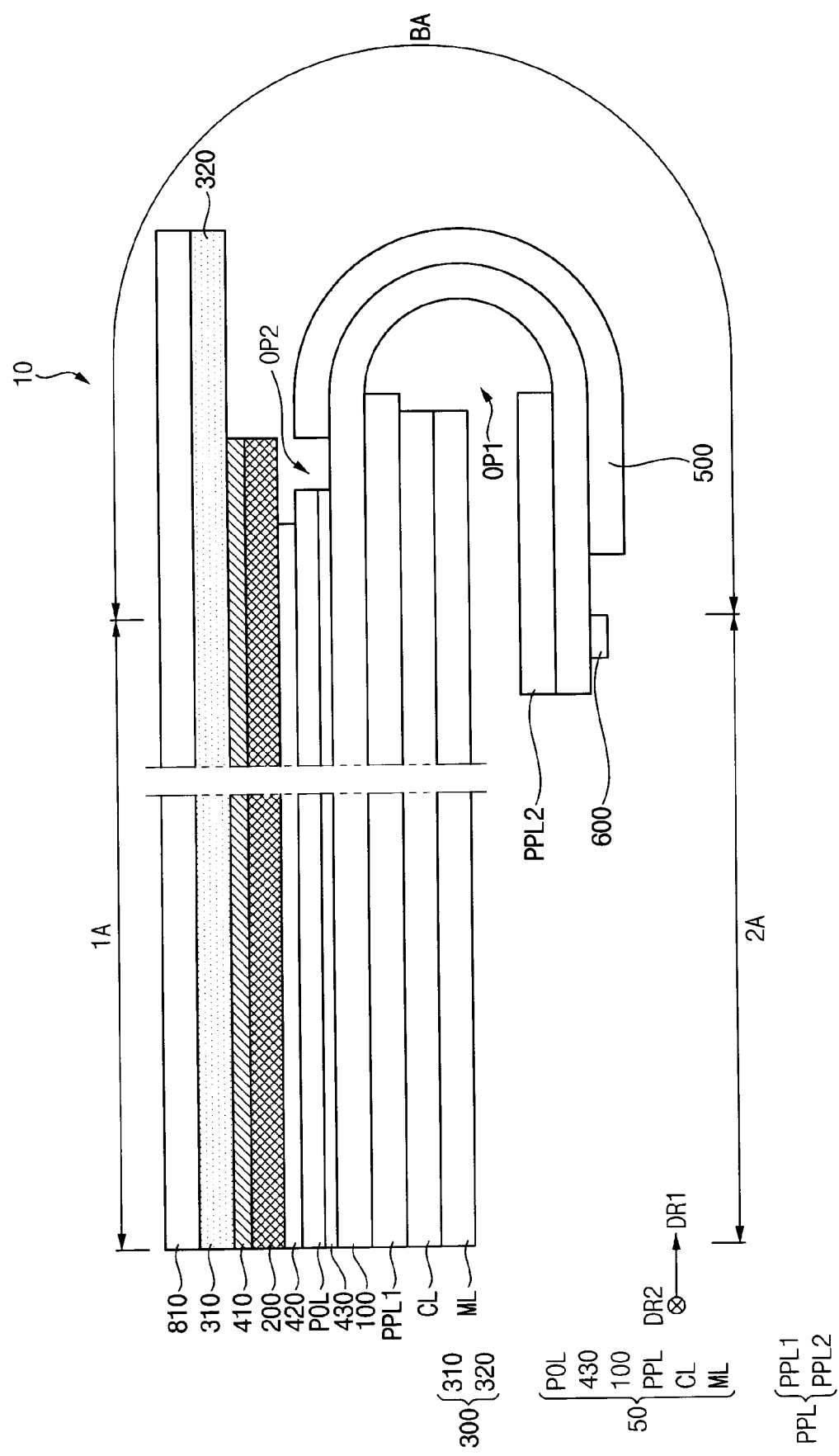

DISPLAY DEVICE AND A METHOD OF MANUFACTURING THE SAME

CROSS-REFERENCE TO RELATED APPLICATION(S)

This application claims priority from and the benefit of Korean Patent Application No. 10-2020-0123678, filed on Sep. 24, 2020, which is hereby incorporated by reference for all purposes as if fully set forth herein.

BACKGROUND

Field

Embodiments of the invention relate generally to a display device and method of manufacturing the same and, more particularly, to a foldable display device including a window protective film and method of manufacturing the same.

Discussion of the Background

Flat panel display devices are replacing cathode ray tube display devices as display devices due to their lightweight and thin characteristics. As representative examples of such flat panel display devices, there are liquid crystal display devices and organic light emitting diode display devices.

At least a portion of the display device may be bent. Therefore, visibility of the display device from various angles may be improved, and the area of the non-display region may be decreased.

The above information disclosed in this Background section is only for understanding of the background of the inventive concepts, and, therefore, it may contain information that does not constitute prior art.

SUMMARY

Applicant recognized that there is a need for a method of manufacturing a display device having a bent portion that minimizes or reduces damage and decreases manufacturing costs.

Display devices constructed according to the principles and illustrative implementations of the invention and methods of manufacturing the same have improved reliability. For example, a display device may include a display panel, window, and a window protective layer that may include an auxiliary portion overlapping the bending area of the display panel. Accordingly, static electricity flowing into the display device from outside may be reduced, and the reliability of the display device may be improved. In addition, the window may expose the auxiliary portion of the window protective layer. Accordingly, damage to the window may be prevented or reduced.

Display devices constructed according to the principles and illustrative implementations of the invention may further include a bending protective layer covering the bending area and an adhesive layer disposed between the window and the window protective layer. The adhesive layer may not contact the bending protective layer. Accordingly, damage to the bending protective layer and the bending area of the display panel may be prevented or reduced, which may improve the reliability of the display device.

Additional features of the inventive concepts will be set forth in the description which follows, and in part will be apparent from the description, or may be learned by practice of the inventive concepts.

According to one aspect of the invention, a display device, includes: a display panel including a first area, a second area spaced apart from the first area, and a bendable area between the first area and the second area; a window disposed on the display panel, the window overlapping the first area; a protective layer disposed on the window, the protective layer including a first portion overlapping the bendable area; and an adhesive disposed between the window and the protective layer.

The protective layer may have a first length and the window may have a second length less than the first length to expose the first portion of the protective layer.

The window may not overlap the bendable area.

The first portion of the protective layer may include an auxiliary portion, the protective layer may have a first length, and the adhesive may have a third length less than the first length to expose the auxiliary portion of the protective layer.

The adhesive may include an adhesive layer that may overlap the first area and may not overlap the bendable area.

The adhesive may include an adhesive layer including a first portion overlapping the window and a second portion overlapping the first portion of the protective layer, and the display device may further include a cover member disposed under the second portion of the adhesive layer.

The first portion of the adhesive layer may overlap the first area, and the second portion of the adhesive layer may overlap the bendable area.

The adhesive layer may have a third length, the window may have a fourth length less than the third length to expose the second portion of the adhesive layer.

The window may contact a lower surface of the first portion of the adhesive layer, and the cover member may contact a lower surface of the second portion of the adhesive layer.

The cover member may contact the window.

The cover member may include an inorganic material.

A bendable protective layer may cover the bendable area of the display panel, and the cover member may be disposed between the adhesive layer and the bendable protective layer.

The cover member may not be adhered to the bendable protective layer.

A metal layer may be disposed under the display panel and supporting the display panel, and the display panel and the window may be flexible.

The window may include ultra-thin glass that has a thickness of about 100 μm or less.

According to another aspect of the invention, a method of manufacturing a display device includes the steps of: disposing a window on a lower structure including a display panel; preparing a protective film including a protective layer having a first portion, a first release film disposed on the protective layer, a second release film disposed under the protective layer, and an adhesive layer disposed between the protective layer and the second release film; removing the second release film from the adhesive layer; attaching the adhesive layer on the window to expose the auxiliary portion of the protective layer; and removing the first release film from the protective layer.

The first portion of the protective layer may include an auxiliary portion and the adhesive layer exposes the auxiliary portion of the protective layer.

The adhesive layer may include a first portion overlapping the window and a second portion overlapping the first portion of the protective layer, and the protective film may further include a cover member disposed under the second portion of the adhesive layer.

The display panel may include a first area, a second area spaced apart from the first area, and a bendable area between the first area and the second area, wherein the window may be disposed on the lower structure overlapping the first area, and the adhesive layer may be attached on the window so that the first portion of the protective layer may overlap the bendable area.

A method of manufacturing a display device, the method includes the steps of: preparing a protective film including a protective layer including an auxiliary portion, a first release film on the protective layer, a second release film under the protective layer, and an adhesive between the protective layer and the second release film; removing the second release film from the adhesive; attaching a window under the adhesive to expose the auxiliary portion of the protective layer; forming a lower structure including a display panel under the window; and removing the first release film from the protective layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 13A and 13B are cross-sectional views illustrating a further embodiment of a method of manufacturing a display device.

DETAILED DESCRIPTION

Figure 1:
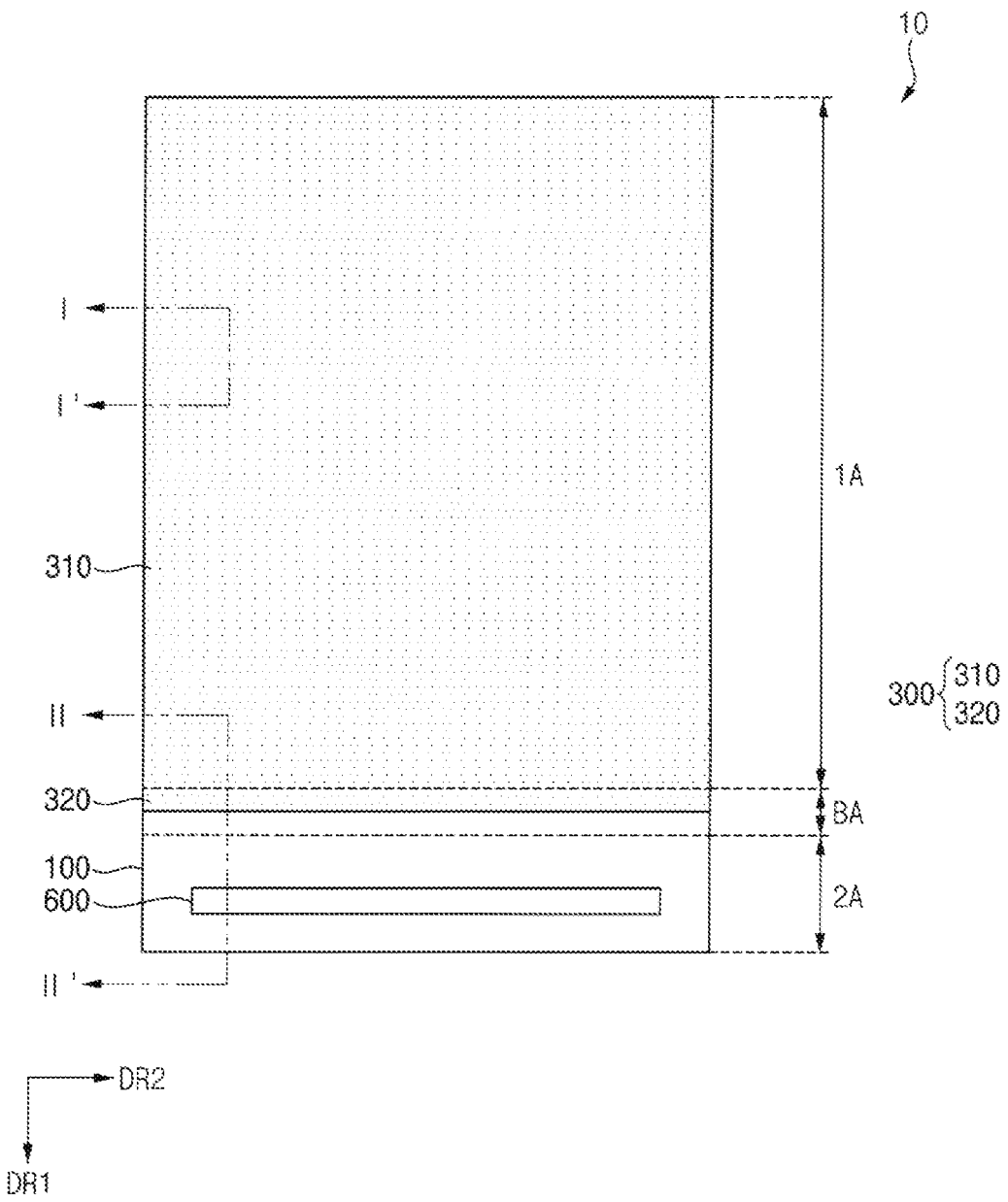
FIG. 1 is a plan view illustrating an embodiment of a display device constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
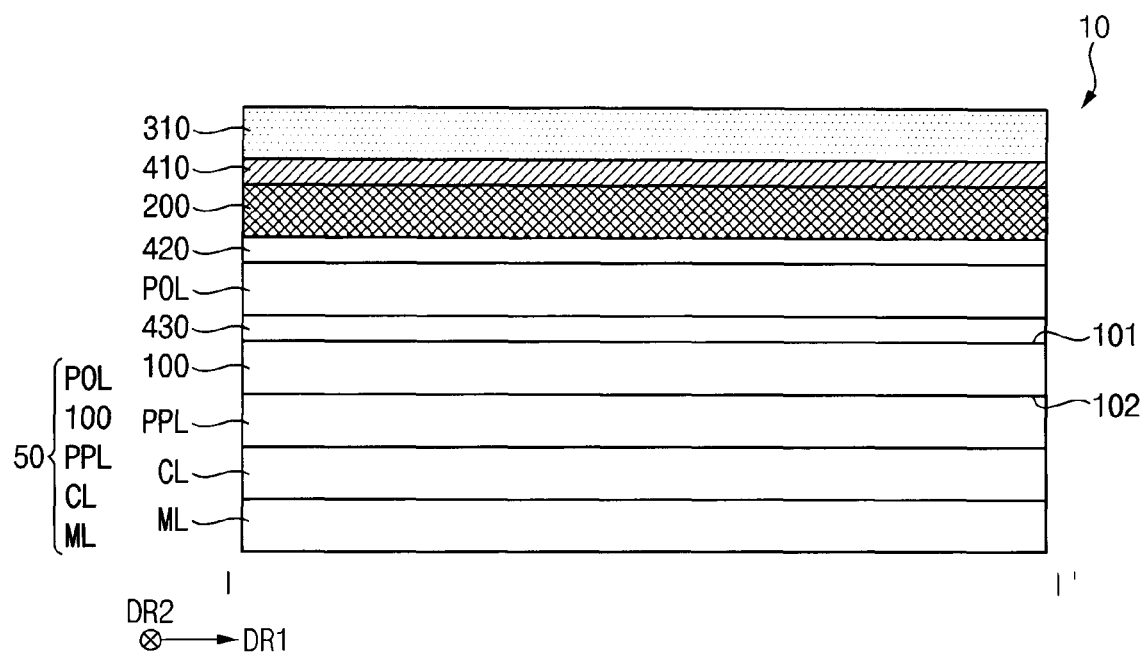
FIG. 2 is a cross-sectional view taken along a line I-I' of FIG. 1.

FIG. 1 is a plan view illustrating an embodiment of a display device constructed according to principles of the invention. FIG. 2 is a cross-sectional view taken along a line I-I' of FIG. 1.

Referring to FIGS. 1 and 2, a display device 10 according to an embodiment may include a display panel 100, a polarizing layer POL, a window 200, a window protective layer 300, a panel protective layer PPL, a cushion layer CL, and a metal layer ML.

The display panel 100 may generate an image. The display panel 100 may provide the generated image toward a first surface 101. For example, the first surface 101 may be an upper surface of the display panel 100. The display panel 100 may include a plurality of pixels for generating the image. Light emitted from each of the pixels may be combined to generate the image.

The display panel 100 may include a first area 1A, a second area 2A, and a bendable area in the form of a bending area BA. For example, the first area 1A may be a display area, and the second area 2A may be a non-display area.

In an embodiment, the second area 2A may be positioned at a side of the first area 1A, and may be spaced apart from the first area 1A. For example, the second area 2A may be spaced apart from the first area 1A in a first direction DR1.

The bending area BA may be positioned between the first area 1A and the second area 2A. The bending area BA may be bent along a bending axis extending in a second direction DR2 intersecting the first direction DR1.

In an embodiment, the display panel 100 may further include a folding area positioned in the first area 1A. The folding area may be an area in which the display panel 100 is folded or unfolded. As the folding area of the display panel 100 is folded or unfolded, the display device 10 may be folded or unfolded in the folding area.

In an embodiment, a driving circuit chip 600 may be disposed on the second area 2A of the display panel 100. In addition, a flexible printed circuit board ("FPCB") may be disposed on an end of the second area 2A (e.g., an end of the second area 2A in the first direction DR1). A printed circuit board ("PCB") may be disposed on an end of the FPCB. Alternatively, the driving circuit chip 600 may be disposed on the FPCB. The driving circuit chip 600, the FPCB, and the PCB may provide a driving signal to the display panel 100. The driving signal may include various signals for driving the display device 10 such as driving voltage, a gate signal, a data signal, or the like.

The polarizing layer POL may be disposed on the first surface 101 of the display panel 100. That is, the polarizing layer POL may be disposed on the display panel 100. The polarizing layer POL may reduce reflection of external light. For example, when the external light having passed through the polarizing layer POL is reflected from a lower portion of the polarizing layer POL (e.g., an upper portion of the display panel 100) and then passes through the polarizing layer POL again, the phase of the reflected external light may be changed as the incoming external light passes through the polarizing layer POL twice. As a result, the phase of reflected external light may be different from the phase of the incoming external light entering the polarizing layer POL to the extent that destructive interference occurs.

Accordingly, the reflection of external light may be reduced to increase visibility of the display device 10.

The window 200 may be disposed on the polarizing layer POL. The window 200 may overlap the first area 1A of the display panel 100. The window 200 may protect the display panel 100 from impurities, impact, etc. from the outside. In an embodiment, the window 200 may include a flexible transparent glass or a flexible transparent plastic. For example, the window 200 may include an ultra-thin glass ("UTG"), a polyimide ("PI"), or the like. For example, a thickness of the UTG may be about 100 μm or less. When the display panel 100 is folded or unfolded, the window 200 having flexibility may also be folded or unfolded. Functional layers such as a reflection preventing layer, a hard-coating layer, a finger print preventing layer, or the like may be disposed on the window 200.

The window protective layer 300 may be disposed on the window 200. The window protective layer 300 may protect the window 200 from impurities, impact, etc. from the outside. For example, the window protective layer 300 may include a polyethylene terephthalate ("PET"), a thermoplastic polyurethane ("TPU"), a polycarbonate ("PC"), or the like.

The window protective layer 300 may include a main portion 310 and a first portion in the form of an auxiliary portion 320. The main portion 310 may overlap the first area 1A of the display panel 100, and the auxiliary portion 320 may overlap the bending area BA of the display panel 100. The window 200 may overlap the main portion 310 of the window protective layer 300, and may not overlap the auxiliary portion 320 of the window protective layer 300. That is, the auxiliary portion 320 of the window protective layer 300 may be exposed by the window 200. This will be described in detail below.

An adhesive to attach layers of the display panel may be in the form of a one or more adhesive layers. In the illustrated embodiment of FIG. 2, first to third adhesive layers 410, 420 and 430 may be disposed between the window protective layer 300 and the window 200, between the window 200 and the polarizing layer POL, and between the polarizing layer POL and the display panel 100, respectively. For example, each of the first to third adhesive layers 410, 420, and 430 may include a pressure sensitive adhesive ("PSA"), an optically clear adhesive ("OCA"), an optically clear resin ("OCR"), or the like.

The panel protective layer PPL may be disposed on a second surface 102 of the display panel 100. The second surface 102 may be opposite to the first surface 101. For example, the second surface 102 may be a lower surface of the display panel 100. That is, the panel protective layer PPL may be disposed under the display panel 100. The panel protective layer PPL may absorb external impact from a lower portion of the display device 10. Accordingly, the panel protective layer PPL may protect the second surface 102 of the display panel 100 from the external impact.

The cushion layer CL may be disposed under the panel protective layer PPL. The cushion layer CL may be disposed under the display panel 100 to reduce an external impact applied to the display panel 100. For example, the cushion layer CL may include a material capable of buffering by containing air, such as a cushion or a sponge. In addition, the cushion layer CL may include an acrylic resin, a polyurethane, a thermoplastic polyurethane, a latex, a polyurethane foam, a polystyrene foam, or the like. The cushion layer CL may be formed as a foam or gel.

The metal layer ML may be disposed under the cushion layer CL. The metal layer ML may support the display panel 100. For example, the metal layer ML may include an alloy sold under the trade designation INVAR by Aperam Alloys Imphy Société par actions simplifiée à associé unique of Imphy FRANCE, which is an alloy of nickel ("Ni") and iron ("Fe"), stainless steel ("SUS"), titanium ("Ti"), copper ("Cu"), or the like, and generically known as FeNi36 or 64FeNi in the United States. In addition, a plurality of holes overlapping the folding area in which the display device 10 is folded or unfolded may be formed in the metal layer ML. As the plurality of holes are formed in the metal layer ML overlapping the folding area, even if the display device 10 is repeatedly folded or unfolded, the folding area of the display device 10 may not be damaged.

The adhesive layers may be disposed between the display panel 100 and the panel protective layer PPL, between the panel protective layer PPL and the cushion layer CL, and between the cushion layer CL and the metal layer ML, respectively. Each of the adhesive layers may include a PSA, an OCA, an OCR, or the like.

Figure 3:
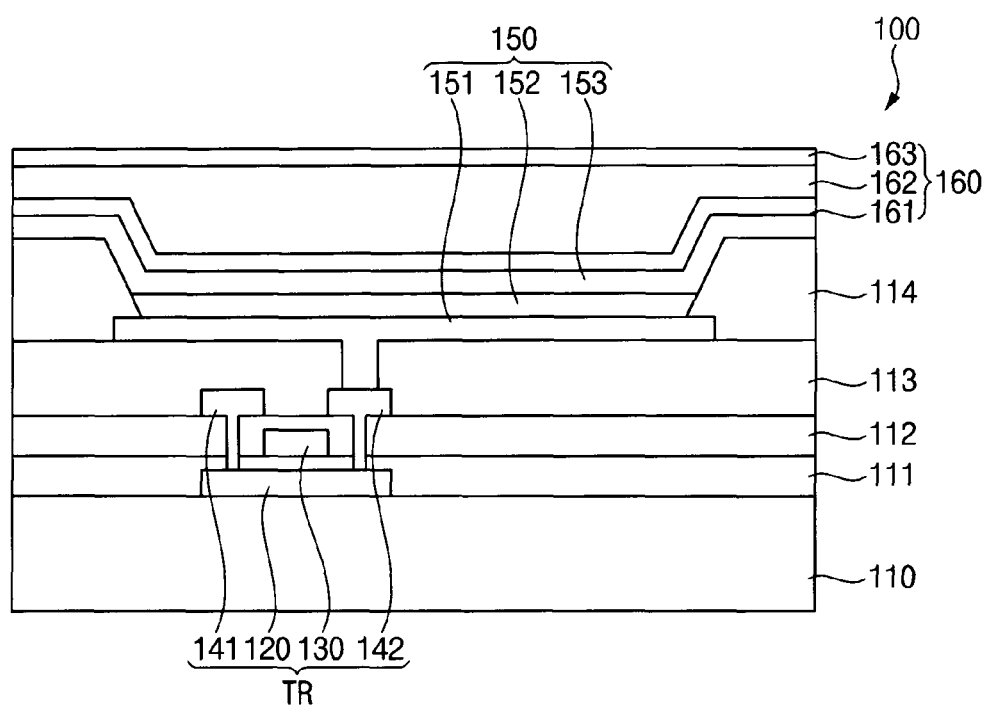
FIG. 3 is a cross-sectional view illustrating a display panel included in the display device of FIG. 2.

FIG. 3 is a cross-sectional view illustrating a display panel included in the display device of FIG. 2.

Referring to FIG. 3, the display panel 100 may include a substrate 110, a transistor TR, a light emitting element 150, and an encapsulation layer 160.

The substrate 110 may be a flexible and insulating substrate. For example, the substrate 110 may include a transparent resin substrate. Particularly, the substrate 110 may include a polyimide substrate. The polyimide substrate may include a first polyimide layer, a barrier film layer, and a second polyimide layer. For another example, the substrate 110 may include a quartz substrate, a synthetic quartz substrate, a calcium fluoride substrate, a fluorine-doped quartz substrate, a soda lime glass substrate, a non-alkali glass substrate, or the like.

A active layer 120 may be disposed on the substrate 110. The active layer 120 may include a source area, a drain area, and a channel area disposed between the source area and the drain area. The active layer 120 may be formed of an amorphous silicon, a polysilicon, an oxide semiconductor, or the like.

A first insulating layer 111 may be disposed on the active layer 120. The first insulating layer 111 may include an inorganic insulation material such as a silicon nitride, a silicon oxide, or the like.

A gate electrode 130 may be disposed on the first insulating layer 111. The gate electrode 130 may overlap the channel area of the active layer 120. The gate electrode 130 may include a metal such as molybdenum ("Mo"), copper ("Cu"), or the like.

A second insulating layer 112 may be disposed on the gate electrode 130. The second insulating layer 112 may include an inorganic insulating material such as a silicon nitride, a silicon oxide, or the like.

A source electrode 141 and a drain electrode 142 may be disposed on the second insulating layer 112. The source electrode 141 and the drain electrode 142 may be connected to the source area and the drain area of the active layer 120, respectively. The source electrode 141 and the drain electrode 142 may include a metal such as aluminum ("Al"), titanium ("Ti"), copper ("Cu"), or the like. The active layer 120, the gate electrode 130, the source electrode 141, and the drain electrode 142 may form the transistor TR.

A third insulating layer 113 may be disposed on the source electrode 141 and the drain electrode 142. The third insulating layer 113 may include an organic insulation material such as a polyimide or the like and/or an inorganic insulation material such as a silicon nitride, a silicon oxide, or the like.

A pixel electrode 151 may be disposed on the third insulating layer 113. The pixel electrode 151 may be connected to the source electrode 141 or the drain electrode 142. The pixel electrode 151 may include metal such as magnesium ("Mg"), silver ("Ag"), gold ("Au"), calcium ("Ca"), lithium ("Li"), chromium ("Cr"), aluminum ("Al"), or the like and/or a transparent conductive oxide such as an indium tin oxide ("ITO"), an indium zinc oxide ("IZO"), a zinc oxide ("ZnO"), or the like.

A fourth insulating layer 114 may be disposed on the pixel electrode 151. The fourth insulating layer 114 may cover a peripheral area of the pixel electrode 151, and may include a pixel opening exposing a center area of the pixel electrode 151. The fourth insulating layer 114 may include an organic insulation material such as a polyimide or the like.

An emission layer 152 may be disposed on the pixel electrode 151. The emission layer 152 may be disposed in the pixel opening of the fourth insulation layer 114. The emission layer 152 may include an organic light emitting material.

An opposite electrode 153 may be disposed on the emission layer 152. The opposite electrode 153 may also be disposed on the fourth insulation layer 114. The opposite electrode 153 may include metal such as Mg, Ag, Au, Ca, Li, Cr, Al, or the like and/or a transparent conductive oxide such as an ITO, an IZO, a ZnO, or the like. The pixel electrode 151, the emission layer 152, and the opposite electrode 153 may form the light emitting element 150.

The encapsulation layer 160 may be disposed on the opposite electrode 153. The encapsulation layer 160 may include at least one inorganic encapsulation layer and at least one organic encapsulation layer. In an embodiment, the encapsulation layer 160 may include a first inorganic encapsulation layer 161 disposed on the opposite electrode 153, an organic encapsulation layer 162 disposed on the first inorganic encapsulation layer 161, and a second inorganic encapsulation layer 163 disposed on the organic encapsulation layer 162. The inorganic encapsulation layer may include a silicon nitride, a silicon oxynitride, or the like, and the organic encapsulation layer may include an epoxy-based resin, an acrylic resin, a polyimide-based resin, or the like.

Figure 4A:
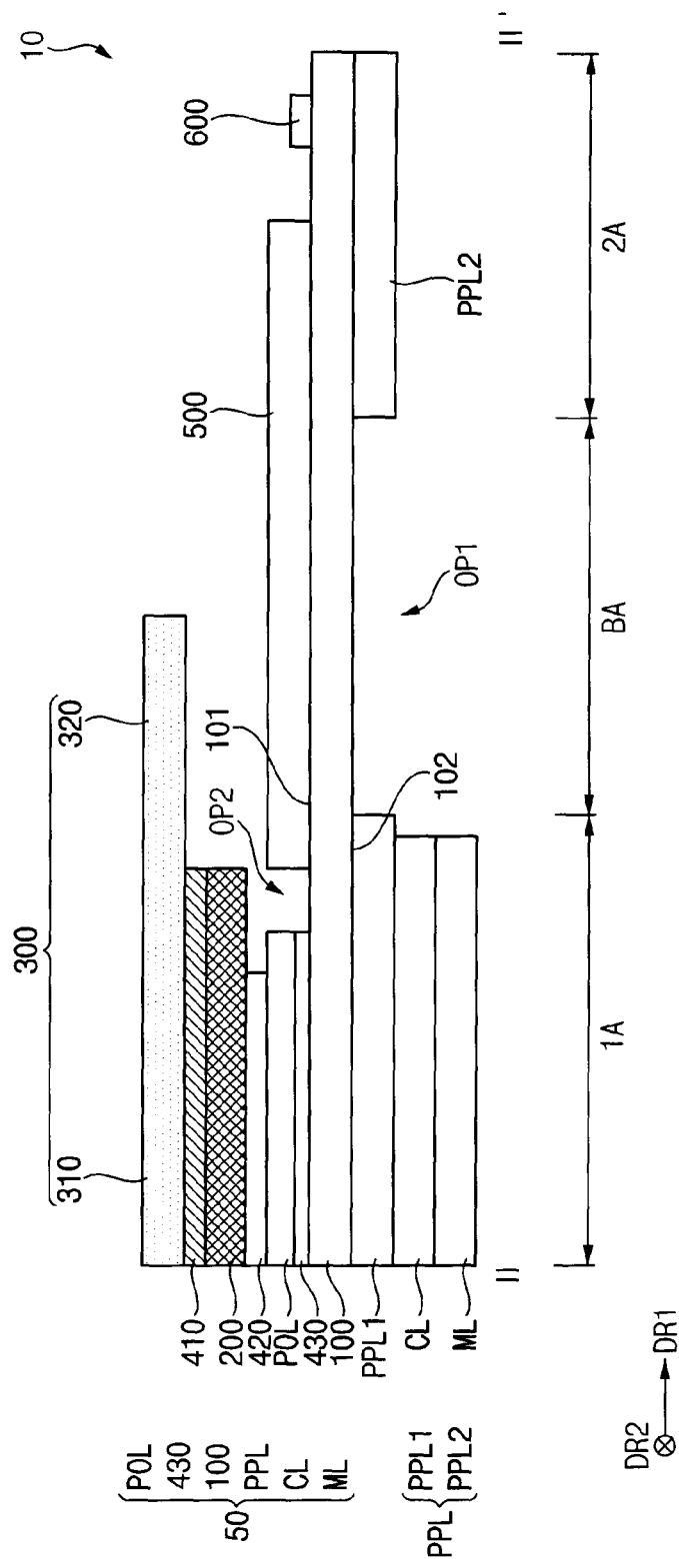
FIG. 4A is a cross-sectional view taken along a line II-II' of FIG. 1.
Figure 4B:
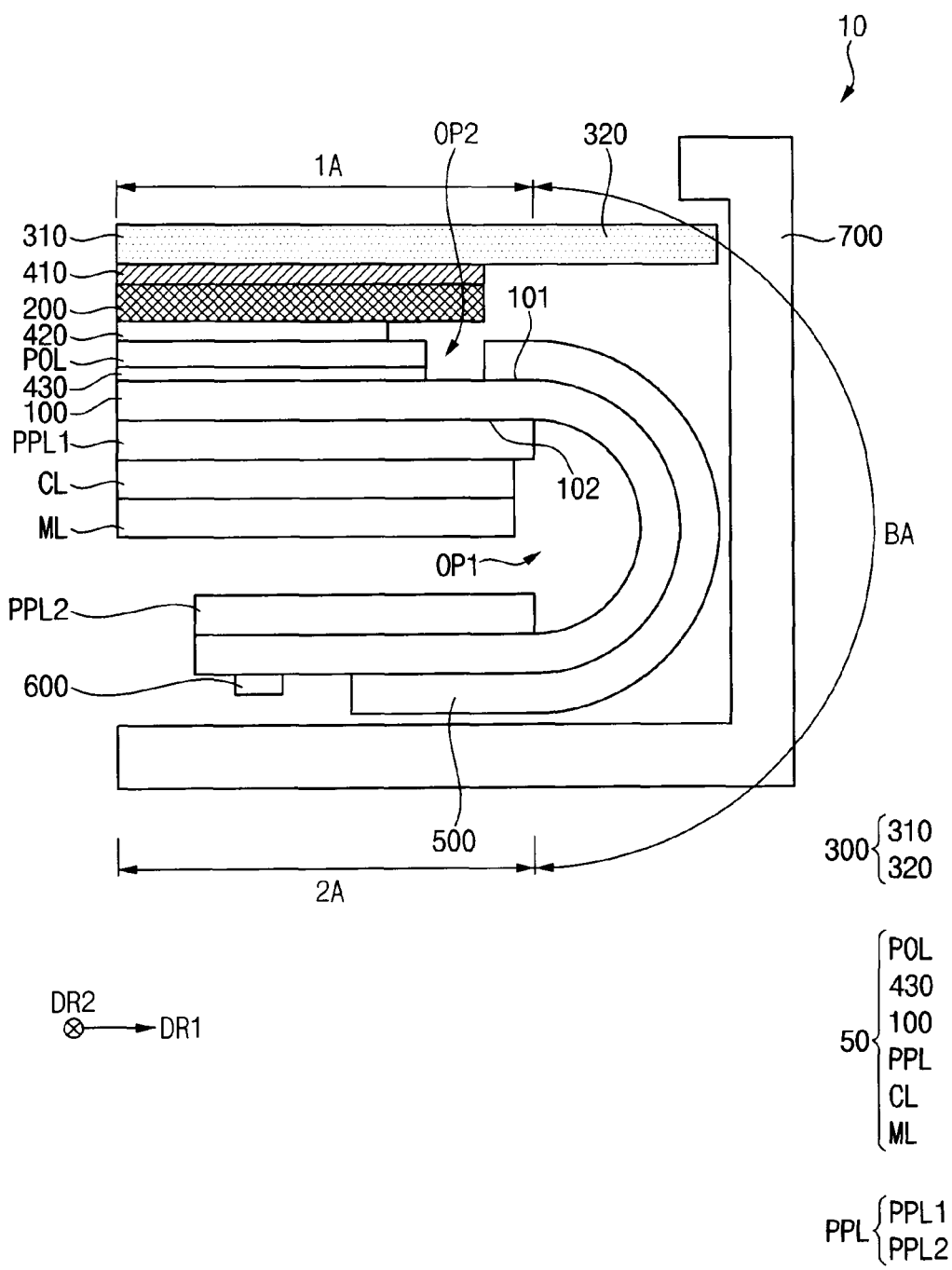
FIG. 4B is a cross-sectional view illustrating a bent configuration of the display device of FIG. 4A.

FIG. 4A is a cross-sectional view taken along a line II-II' of FIG. 1. FIG. 4B is a cross-sectional view illustrating a bent configuration of the display device of FIG. 4A.

Referring to FIGS. 4A and 4B, the bending area BA of the display panel 100 may be bent about the bending axis extending in the second direction DR2. For example, as illustrated in FIG. 4B, the bending area BA may be bent so that portions of the second surface 102 of the display panel 100 face each other and the first area 1A overlaps the second area 2A.

In an embodiment, the panel protective film PPL may include a first panel protective film PPL1 overlapping the first area 1A and a second panel protective film PPL2 overlapping the second area 2A. The second panel protective film PPL2 may be spaced apart from the first panel protective film PPL1 in the first direction DR1. Accordingly, a first opening OP1 may be formed between the first and second panel protective films PPL1 and PPL2. The first opening OP1 may overlap the bending area BA. The first opening OP1 may prevent the panel protective film PPL from peeling off the display panel 100 as the display panel 100 is bent. The cushion layer CL and the metal layer ML may be disposed under the first panel protective film PPL1. As such, the cushion layer CL and the metal layer ML may not overlap the bending area BA. In addition, a spacer may be disposed under the metal layer ML. That is, the spacer may be disposed between the metal layer ML and the second window protective film PPL2 overlapping each other while the display panel 100 is bent.

In an embodiment, as illustrated in FIG. 4B, the display device 10 may further include a bracket 700. The bracket 700 may accommodate portions of the window protective layer 300, the window 200, the display panel 100, and the like. The bracket 700 may protect the display panel 100 from impact, impurities, static electricity, etc. from the outside.

A bending protective layer 500 may be disposed on the bending area BA of the display panel 100. That is, the bending protective layer 500 may be disposed on the first surface 101 of the display panel 100 and may cover the bending area BA. According to embodiments, a portion of the bending protective layer 500 may overlap a portion of the first area 1A or a portion of the second area 2A of the display panel 100.

The bending protective layer 500 may protect the bending area BA of the display panel 100. For example, the bending protective layer 500 may protect a conductive layer in the bending area BA of the display panel 100. Wires for transmitting the driving signal to the display panel 100 may be disposed in the conductive layer. When a stacked structure is bent, there is a stress neutral plane in the stacked structure. If the bending protective layer 500 is omitted, an excessive tensile stress may be applied, when the display panel 100 is bent, to the conductive layer in the bending area BA because the conductive layer may not be in the stress neutral plane. However, the bending protective layer 500 may be formed on the bending area BA, and the thickness and modulus of elasticity of the bending protective layer 500 may be controlled so that the location of the stress neutral plane in the stack structure including the display panel 100, the bending protective layer 500, etc. may be adjusted. The location of the stress neutral plane may be around the conductive layer by forming the bending protective layer 500. Accordingly, tensile stress applied to the conductive layer may be minimized. In addition, the bending protective layer 500 may protect the bending area BA of the display panel 100 from static electricity introduced from the outside.

In an embodiment, as illustrated in FIGS. 4A and 4B, the polarizing layer POL and the bending protective layer 500 disposed on the first surface 101 of the display panel 100 may be spaced apart from each other. For example, in order to minimize defects that occur when forming the polarizing layer POL or the bending protective layer 500 on the display panel 100, the polarizing layer POL and the bending protective layer 500 may be spaced apart from each other. Accordingly, a second opening OP2 may be formed between the polarizing layer POL and the bending protective layer 500 disposed on the first surface 101 of the display panel 100. The second opening OP2 may expose a portion of the first surface 101 of the display panel 100.

The window 200 may overlap the first area 1A. In an embodiment, the window 200 may not overlap the bending area BA. When the window 200 extends to overlap the bending area BA, as the portion of the window 200 not supported by the lower structure 50 underneath the unsupported portion (e.g., polarizing layer POL, display panel 100, metal layer ML, etc.) increases, the risk of damaging the window 200 may increase. Accordingly, in order to reduce the risk of damaging the window 200, the window 200 may be extended by a length overlapping the first area 1A as illustrated in FIG. 4A. In another embodiment, the window 200 may extend so that a portion of the window 200 overlaps the bending area BA.

In an embodiment, the length of the window protective layer 300 in the first direction DR1 may be greater than a length of the window 200 in the first direction DR1. The window protective layer 300 may include the main portion 310 overlapping the window 200 and the auxiliary portion 320 extending from the main portion 310 in the first direction DR1. For example, the main portion 310 may overlap the first area 1A, and the auxiliary portion 320 may overlap the bending area BA. The auxiliary portion 320 may not overlap the window 200. That is, the window 200 may expose the auxiliary portion 320. The auxiliary portion 320 may overlap the first opening OP1 and the bending protective layer 500.

For example, as illustrated in FIG. 4B, the auxiliary portion 320 of the window protective layer 300 may extend to be adjacent to the bracket 700. For example, the auxiliary portion 320 may contact or be spaced apart from the bracket 700 by a small gap. As the auxiliary portion 320 extends to be adjacent to the bracket 700, static electricity flowing into the display device 10 (e.g., the display panel 100 exposed by the second opening OP2) from the outside may be reduced. Accordingly, damage to the display panel 100 due to the static electricity may be minimized, and the reliability of the display device 10 may be improved.

In an embodiment, the length of the first adhesive layer 410 in the first direction DR1 may be less than the length of the window protective layer 300 in the first direction DR1. For example, the first adhesive layer 410 may overlap the window 200 and the main portion 310 of the window protective layer 300, and may not overlap the auxiliary portion 320 of the window protective layer 300. That is, the first adhesive layer 410 may be disposed only between the window 200 and the main portion 310 of the window protective layer 300 overlapping the window 200. In other words, the first adhesive layer 410 may expose the auxiliary portion 320 of the window protective layer 300. The first adhesive layer 410 may overlap the first area 1A and may not overlap the bending area BA. For example, the length of the first adhesive layer 410 in the first direction DR1 may be substantially the same as the length of the window 200 in the first direction DR1.

As the first adhesive layer 410 does not overlap the bending area BA, even if the window protective layer 300 is bent toward the bending protective layer 500, the first adhesive layer 410 may not contact the bending protective layer 500. If the first adhesive layer 410 contacts the bending protective layer 500, the bending protective layer 500 may be damaged when the first adhesive layer 410 is adhered to the bending protective layer 500 and then detached. However, according to the embodiments, the first adhesive layer 410 may not overlap the bending area BA. That is, the first adhesive layer 410 may expose the auxiliary portion 320 of the window protective layer 300. Accordingly, even if the window protective layer 300 is bent toward the bending protective layer 500, the bending protective layer 500 may directly contact the auxiliary portion 320 of the window protective layer 300, not the first adhesive layer 410. That is, the auxiliary portion 320 and the bending protective layer 500 may not be adhered to each other. Accordingly, damage to the bending protective layer 500 may be prevented, and the conductive layer in the bending area BA of the display panel 100 may be protected.

Figure 5:
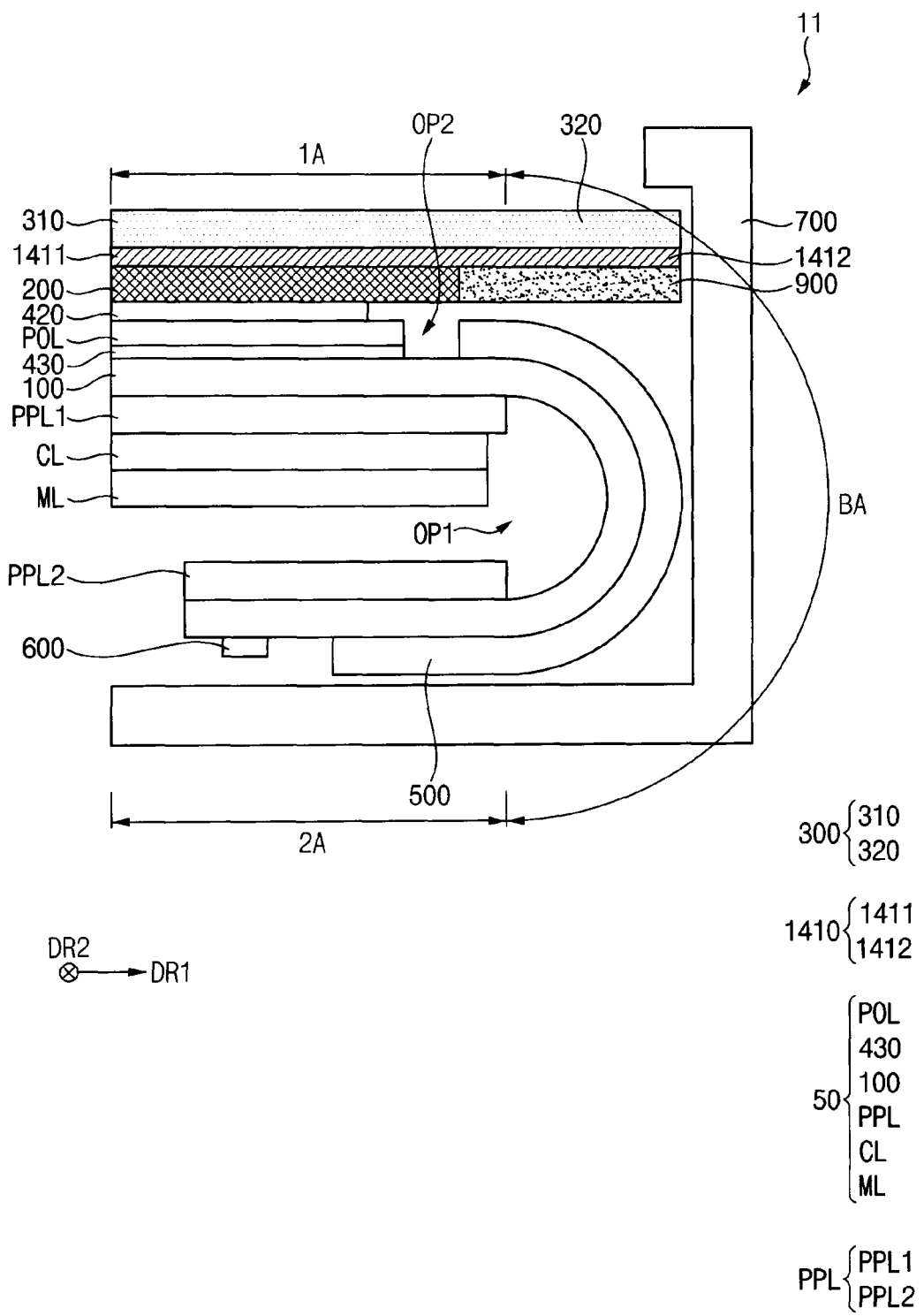
FIG. 5 is a cross-sectional view illustrating another embodiment of a display device constructed according to principles of the invention.

FIG. 5 is a cross-sectional view illustrating another embodiment of a display device constructed according to principles of the invention.

Referring to FIG. 5, a display device 11 according to another embodiment may include the display panel 100, the polarizing layer POL, the window 200, the window protective layer 300, a first adhesive layer 1410, and a cover member 900. The display device 11 may be the substantially same as or similar to the display device 10 according to an embodiment described with reference to FIGS. 4A and 4B except for the first adhesive layer 1410 and the cover member 900. Therefore, repetitive descriptions will be omitted to avoid redundancy.

The first adhesive layer 1410 may be disposed between the window protective layer 300 and the window 200. The first adhesive layer 1410 may overlap the main portion 310 and the auxiliary portion 320 of the window protective layer 300. The first adhesive layer 1410 may include a first portion 1411 overlapping the main portion 310 of the window protective layer 300 and a second portion 1412 overlapping the auxiliary portion 320 of the window protective layer 300. The second portion 1412 may be positioned in the first direction DR1 from the first portion 1411. For example, the first portion 1411 may overlap the first area 1A, and the second portion 1412 may overlap the bending area BA. The second portion 1412 may overlap the first opening OP1 and the bending protective layer 500.

The window 200 may overlap the first portion 1411 of the first adhesive layer 1410 or the first portion 1411 of the first adhesive layer 1410 may overlap the window 200, and the window 200 may not overlap the second portion 1412 of the first adhesive layer 1410 or the second portion 1412 of the first adhesive layer 1410 may not overlap the window 200. The length of the window 200 in the first direction DR1 may be less than the length of the first adhesive layer 1410 in the first direction DR1. That is, the window 200 may expose the second portion 1412 of the first adhesive layer 1410.

The cover member 900 may be disposed under the second portion 1412 of the first adhesive layer 1410. That is, the cover member 900 may overlap the bending area BA, and may be disposed between the first adhesive layer 1410 and the bending protective layer 500. The cover member 900 may overlap the first opening OP1. The cover member 900 may cover a lower surface of the second portion 1412 of the first adhesive layer 1410 exposed by the window 200. Accordingly, even if the window protective layer 300 is bent toward the bending protective layer 500, the second portion 1412 of the first adhesive layer 1410 may not directly contact the bending protective layer 500.

An adhesive layer may not be disposed between the cover member 900 and the bending protective layer 500. That is, the cover member 900 may not be adhered to the bending protective layer 500. For example, even if the window protective layer 300 is bent toward the bending protective layer 500 so that the cover member 900 directly contacts the bending protective layer 500, the cover member 900 may not be adhered to the bending protective layer 500. As such, the cover member 900 may prevent the second portion 1412 of the first adhesive layer 1410 from directly contacting the bending protective layer 500. Accordingly, damage to the bending protective layer 500 may be prevented, and the conductive layer in the bending area BA of the display panel 100 may be protected.

The cover member 900 may include an inorganic material such as a silicon oxide, a silicon nitride, or the like. As another example, the cover member 900 may include an organic material such as an epoxy resin, an acrylic resin, a polyester resin, a polyimide resin, or the like.

Each of the window 200 and the cover member 900 may directly contact the first adhesive layer 1410. That is, an upper surface of the window 200 may directly contact a lower surface of the first portion 1411 of the first adhesive layer 1410. An upper surface of the cover member 900 may directly contact a lower surface of the second portion 1412 of the first adhesive layer 1410.

For example, as illustrated in FIG. 5, the window 200 and the cover member 900 may contact each other. For another example, the window 200 and the cover member 900 may be spaced apart from each other in the first direction DR1. As such, the window 200 and the cover member 900 may be spaced apart by a predetermined distance within a range in which the first adhesive layer 1410 does not contact the bending protective layer 500. For example, as illustrated in FIG. 5, the thickness of the cover member 900 may be substantially the same as a thickness of the window 200. As another example, the thickness of the cover member 900 may be less or greater than the thickness of the window 200.

Figure 6:
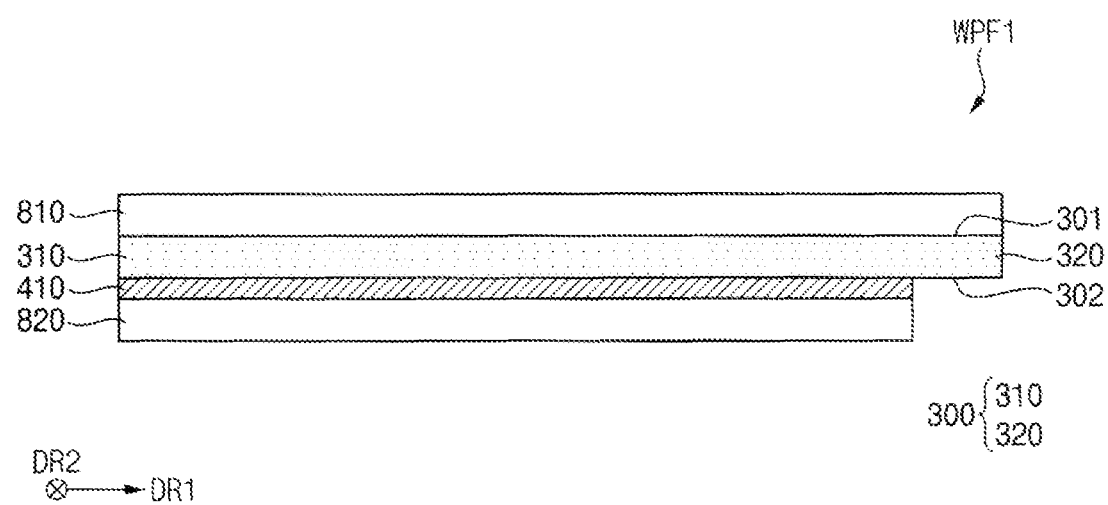
FIG. 6 is a cross-sectional view of an embodiment of a window protective film constructed according to principles of the invention.

FIG. 6 is a cross-sectional view of an embodiment of a window protective film constructed according to principles of the invention.

Referring to FIG. 6, a window protective film WPF1 according to an embodiment may include a window protective layer 300, a first adhesive layer 410, a first release film 810, and a second release film 820. The first and second release films 810 and 820 may protect the window protective layer 300 and the first adhesive layer 410 during a manufacturing process of the display device 10 (e.g., transporting the window protective film WPF1). For example, the second release film 820 may protect the first adhesive layer 410 until the window protective layer 300 and the first adhesive layer 410 are attached to the window 200. Each of the first and second release films 810 and 820 may be removed from each of the window protective layer 300 and the first adhesive layer 410 during the manufacturing process of the display device 10.

The window protective film WPF1 may correspond to the display device 10 described with reference to FIGS. 4A and 4B. That is, the window protective layer 300 and the first adhesive layer 410 included in the window protective film WPF1 may be substantially the same as the window protective layer 300 and the first adhesive layer 410 included in the display device 10, respectively. Therefore, repetitive descriptions will be omitted to avoid redundancy.

The first release film 810 may be disposed on a surface of the window protective layer 300. For example, the surface may be an upper surface of the window protective layer 300. A lower surface of the first release film 810 may directly contact the upper surface of the window protective layer 300. For example, the first release film 810 may include a base film and an adhesive layer disposed under the base film to contact the window protective layer 300.

The second release film 820 may be disposed on another surface of the window protective layer 300. For example, the other surface may be a lower surface of the window protective layer 300.

The first adhesive layer 410 may be disposed between the window protective layer 300 and the second release film 820. For example, a lower surface of the first adhesive layer 410 may directly contact an upper surface of the second release film 820. Accordingly, the second release film 820 may not include an adhesive layer. The first adhesive layer 410 may overlap the main portion 310 of the window protective layer 300, and may not overlap the auxiliary portion 320 of the window protective layer 300. That is, the first adhesive layer 410 may expose the auxiliary portion 320 of the window protective layer 300.

For example, a first release force between the first release film 810 and the window protective layer 300 may be greater than a second release force between the second release film 820 and the first adhesive layer 410. Accordingly, when the second release film 820 is removed from the first adhesive layer 410, the first release film 810 may remain attached to the window protective layer 300.

In an embodiment, the first release film 810 may cover substantially the entire upper surface of the window protective layer 300. The second release film 820 may cover substantially the entire lower surface of the first adhesive layer 410. For example, as illustrated in FIG. 6, a length of the first release film 810 in the first direction DR1 may be the substantially same as the length of the window protective layer 300 in the first direction DR1. The length of the second release film 820 in the first direction DR1 may be the substantially same as the length of the first adhesive layer 300 in the first direction DR1. As another example, the length of the first release film 810 in the first direction DR1 may be greater than the length of the window protective layer 300 in the first direction DR1. The length of the second release film 820 in the first direction DR1 may be greater than the length of the first adhesive layer 300 in the first direction DR1.

Figure 7A:
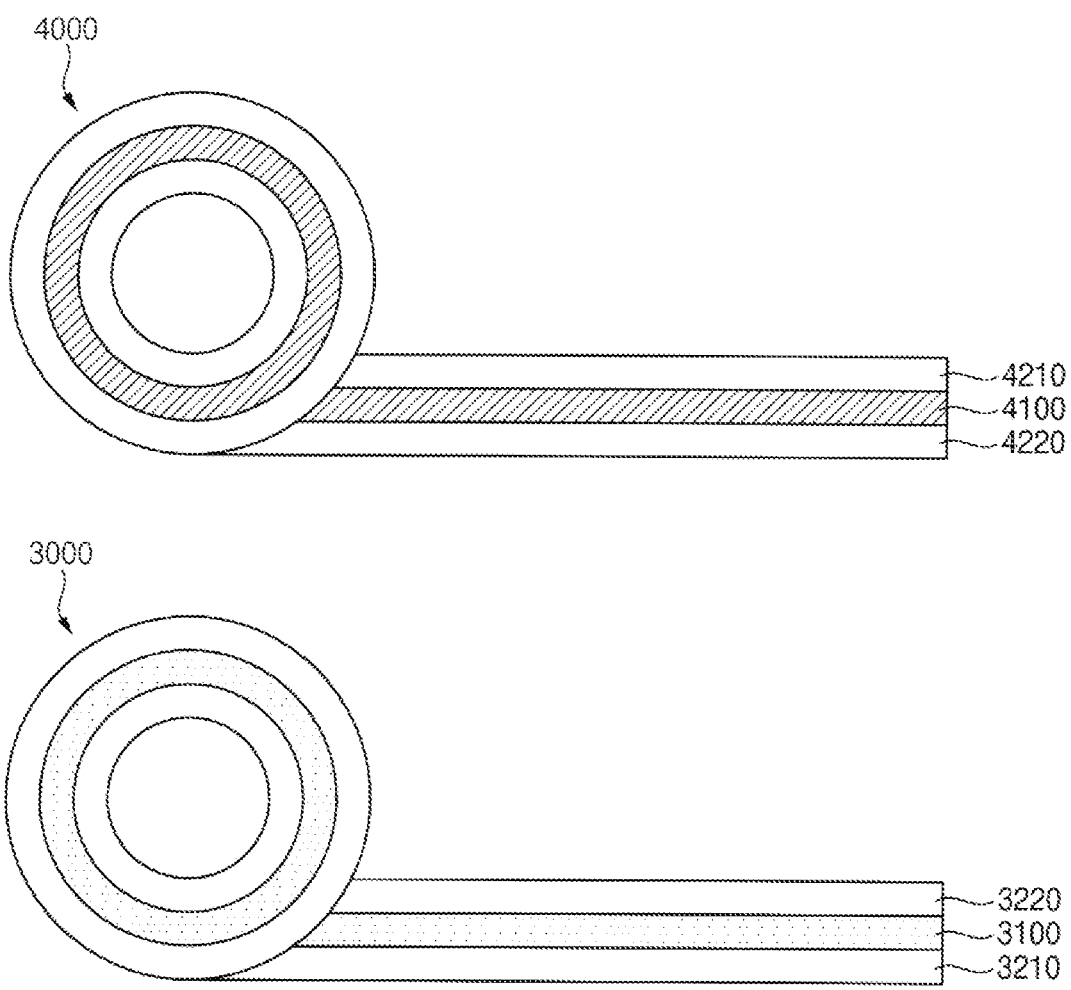
FIGS. 7A and 7B are views illustrating an embodiment of a method of manufacturing the window protective film of FIG. 6 according to principles of the invention.
Figure 7B:
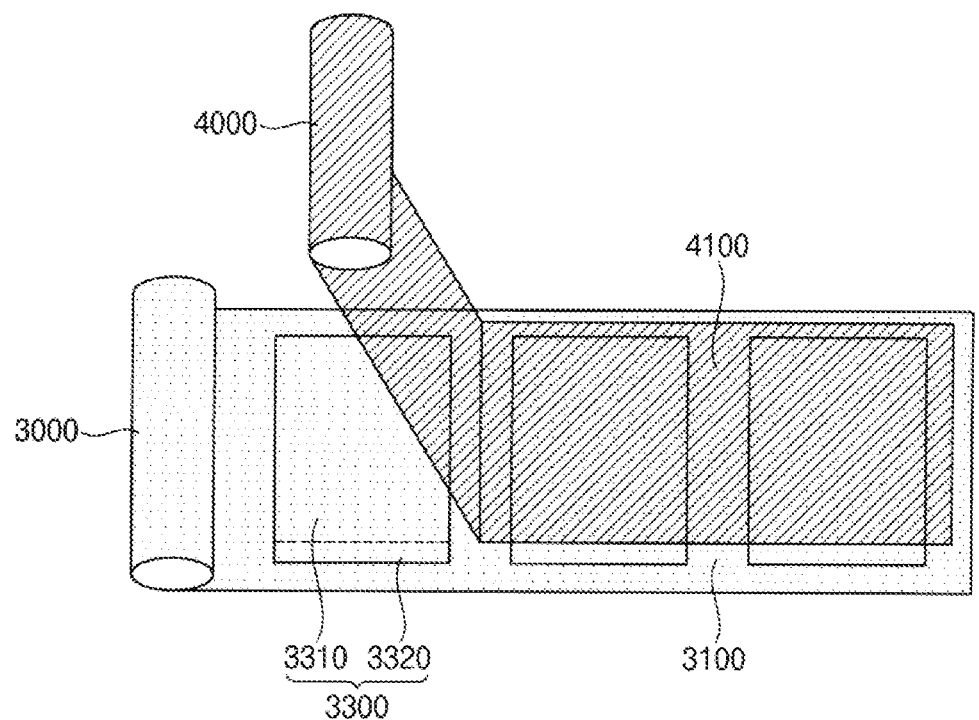

FIGS. 7A and 7B are views illustrating an embodiment of a method of manufacturing the window protective film of FIG. 6 according to principles of the invention.

Referring to FIGS. 7A and 7B, a protective sheet 3000 and an adhesive sheet 4000 may be prepared. For example, each of the protective sheet 3000 and the adhesive sheet 4000 may be rolled on a roller.

The protective sheet 3000 may include a protective layer 3100, a first release film 3210 disposed on a surface of the protective layer 3100, and a third release film 3220 disposed on another surface opposite to the surface of the protective layer 3100. As illustrated in FIG. 7B, a plurality of first cells 3300 may be defined on the protective layer 3100 of the protective sheet 3000. Each of the first cells 3300 may correspond to the window protective layer 300 included in the window protective film WPF1 of FIG. 6. Each of the first cells 3300 may include a main portion 3310 and an auxiliary portion 3320.

The adhesive sheet 4000 may include an adhesive layer 4100, a second release film 4210 disposed on a surface of the adhesive layer 4100, and a fourth release film 4220 disposed on another surface opposite to the surface of the adhesive layer 4100.

The third release film 3220 included in the protective sheet 3000 may be removed, and the fourth release film 4220 included in the adhesive sheet 4000 may be removed. That is, the third release film 3220 may be removed from the protective layer 3100, and the first release film 3210 may remain attached to the protective layer 3100. The fourth release film 4220 may be removed from the adhesive layer 4100, and the second release film 4210 may remain attached to the adhesive layer 4100.

Next, the adhesive sheet 4000 may be disposed on the protective sheet 3000 so that the another surface of the protective layer 3100 faces the another surface of the adhesive layer 4100. In an embodiment, the adhesive sheet 4000 may be attached on the protective sheet 3000 so that the adhesive layer 4100 exposes a portion of the protective layer 3100. For example, as illustrated in FIG. 7B, the adhesive layer 4100 may be attached on the protective layer 3100 so that the adhesive layer 4100 overlaps the main portion 3310 of each of the first cells 3300 and does not overlap the auxiliary portion 3320.

Next, the window protective film WPF1 may be formed by cutting (e.g., laser cutting) the attached protective sheet 3000 and the adhesive sheet 4000 along an edge of each of the first cells 3300.

Figure 8A:
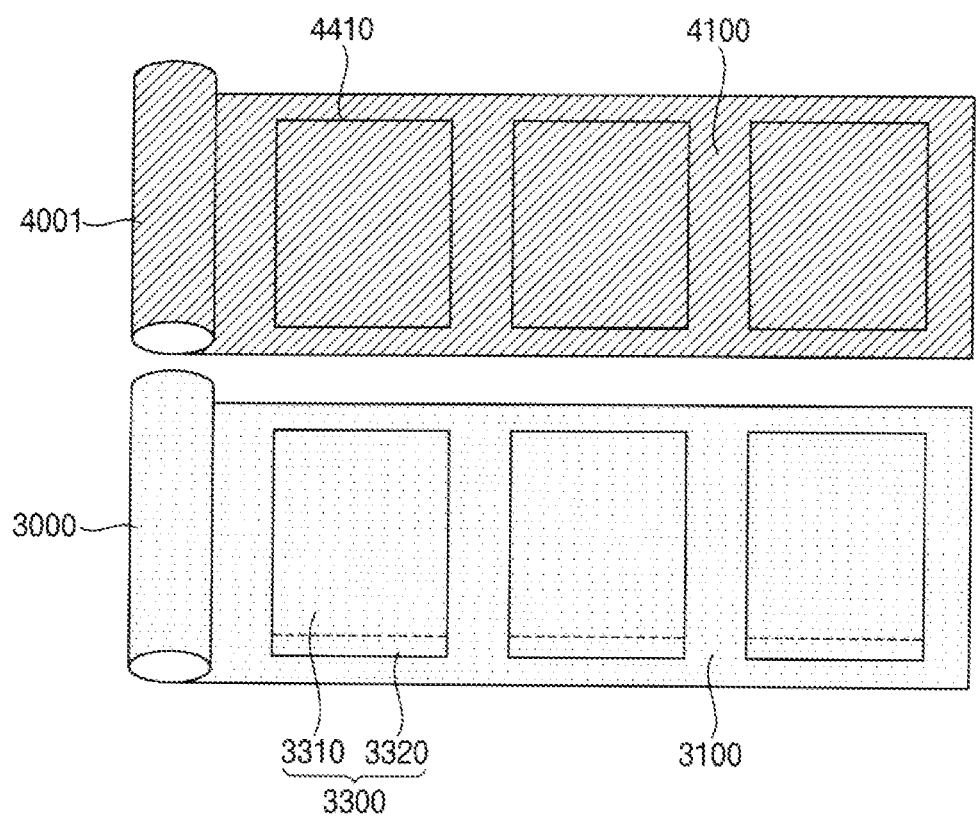
FIGS. 8A and 8B are views illustrating another embodiment of a method of manufacturing the window protective film of FIG. 6 according to principles of the invention.
Figure 8B:
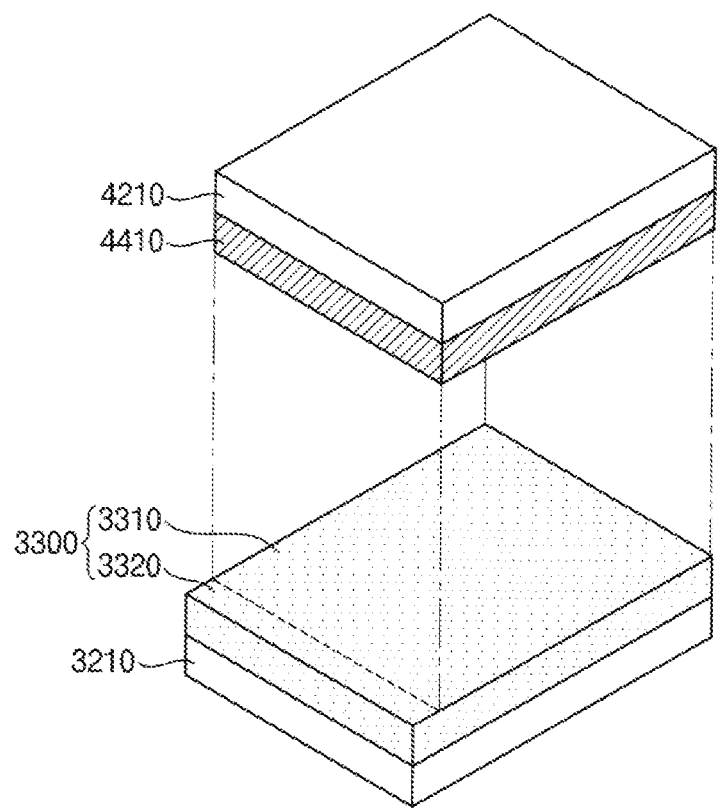

FIGS. 8A and 8B are views illustrating another embodiment of a method of manufacturing the window protective film of FIG. 6 according to principles of the invention.

Referring to FIGS. 8A and 8B, a protective sheet 3000 and an adhesive sheet 4001 may be prepared. The protective sheet 3000 may be substantially the same as or similar to the protective sheet 3000 described with reference to FIGS. 7A and 7B. Therefore, the following description will focus on the differences from the above embodiment described with reference to FIGS. 7A and 7B to avoid redundancy.

A plurality of second cells 4410 may be defined on the adhesive layer 4100 of the adhesive sheet 4001. Each of the second cells 4410 may correspond to the first adhesive layer 410 included in the window protective film WPF1 of FIG. 6. For example, each of the second cells 4410 may have substantially the same shape as the main portion 3310 of each of the first cells 3300.

Next, the protective sheet 3000 may be cut along an edge of each of the first cells 3300, and the adhesive sheet 4001 may be cut along an edge of each of the second cells 4410. That is, before attaching the adhesive sheet 4001 to the protective sheet 3000, the protective sheet 3000 and the adhesive sheet 4001 may be cut along the edges of the first and second cells 3300 and 4410, respectively. In this case, the amount of the adhesive layer 4100 discarded during the manufacturing process may be relatively reduced.

Next, the third release film 3220 may be removed from each of the cut first cells 3300, and the fourth release film 4220 may be removed from each of the cut second cells 4410.

Next, the second cell 4410 may be disposed on the first cell 3300 so that the protective layer 3100 and the adhesive layer 4100 face each other. In an embodiment, the second cell 4410 may be disposed on the first cell 3300 to expose a portion of the first cell 3300. For example, as illustrated in FIG. 8B, the second cell 4410 may be disposed on the first cell 3300 so that the second cell 4410 overlaps the main portion 3310 of the first cell 3300 and does not overlap the auxiliary portion 3320.

Figure 9A:
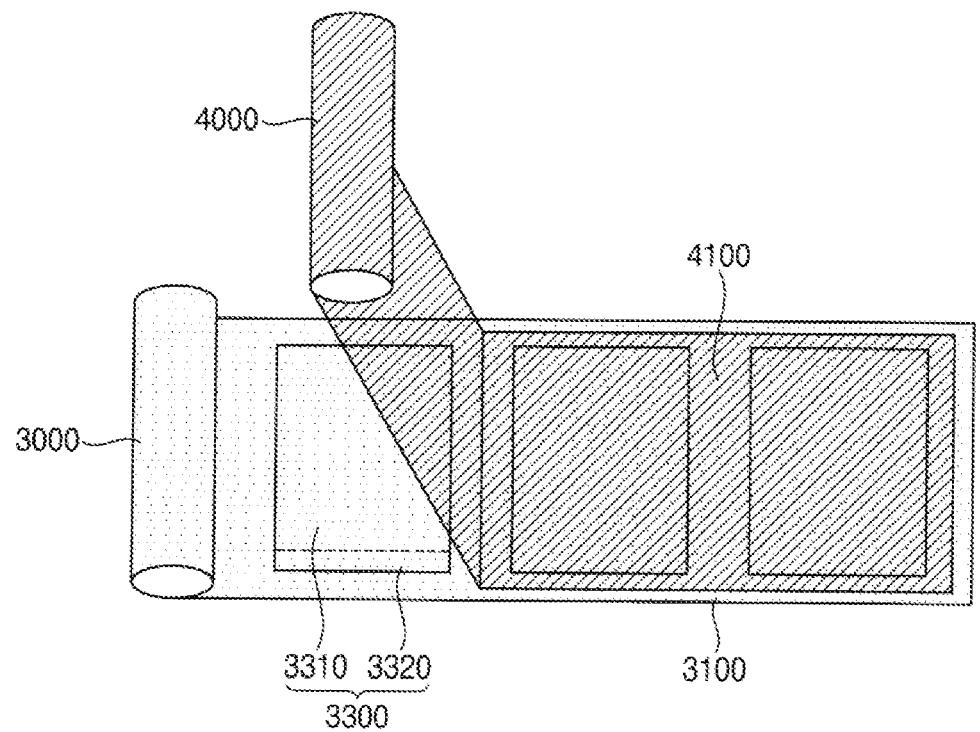
FIGS. 9A and 9B are views illustrating still another embodiment of a method of manufacturing the window protective film of FIG. 6 according to principles of the invention.
Figure 9B:
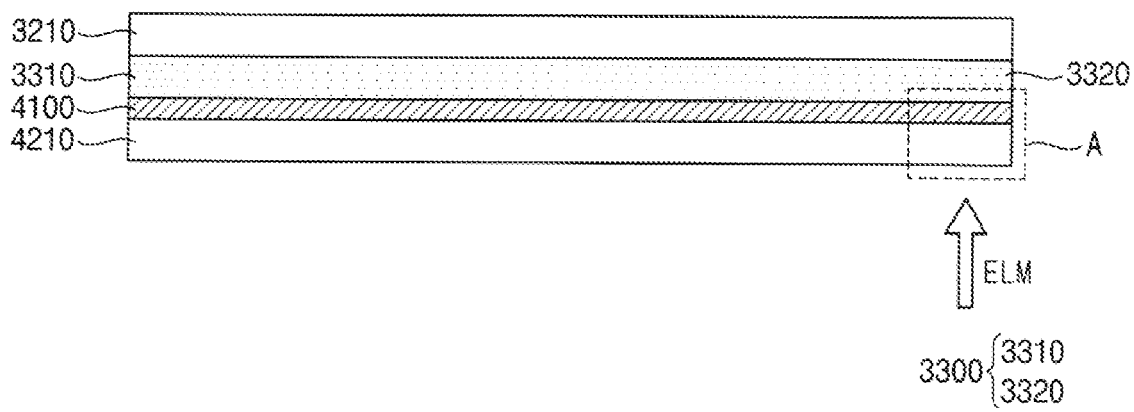

FIGS. 9A and 9B are views illustrating still another embodiment of a method of manufacturing the window protective film of FIG. 6 according to principles of the invention.

The following description will focus on the differences from the above embodiment described with reference to FIGS. 7A and 7B to avoid redundancy.

Referring to FIGS. 9A and 9B, the adhesive sheet 4000 may be disposed on the protective sheet 3000 so that the adhesive layer 4100 overlaps the main portion 3310 and the auxiliary portion 3320 of each of the first cells 3300. That is, the adhesive sheet 4000 may be attached on the protective sheet 3000 so that the adhesive layer 4100 covers the entirety of each of the first cells 3300.

Next, the attached protective sheet 3000 and the adhesive sheet 4000 may be cut along an edge of each of the first cells 3300. FIG. 9B illustrate a state in which the attached protective sheet 3000 and the adhesive sheet 4000 are cut along the edge of each of the first cells 3300.

Next, the window protective film WPF1 of FIG. 6 may be formed by removing a portion of the second release film 4210 and a portion of the adhesive layer 4100 (an area "A" in FIG. 9B) overlapping the auxiliary portion 3320 of the first cell 3300. For example, the portion of the second release film 4210 and the portion of the adhesive layer 4100 may be removed by irradiation of laser, but a removal method is not limited thereto.

Figure 10:
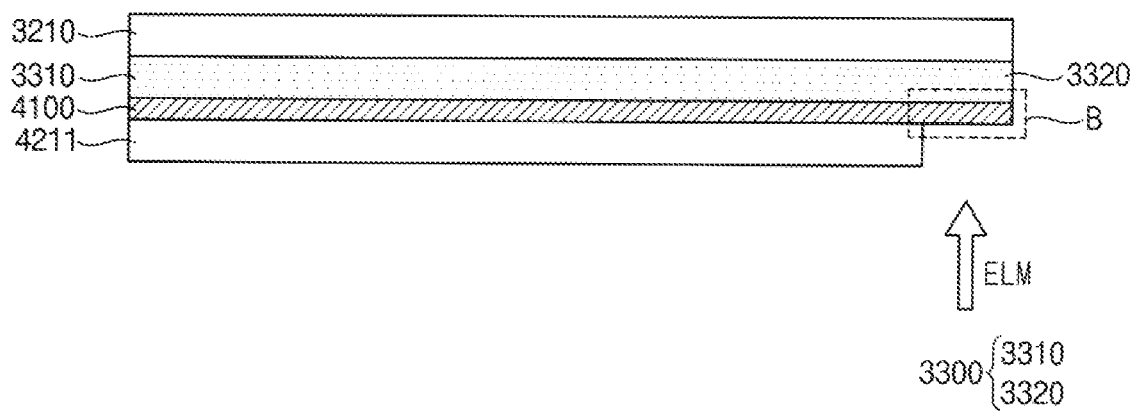
FIG. 10 is a cross-sectional view illustrating yet another embodiment of a method of manufacturing the window protective film of FIG. 6 according to principles of the invention.

FIG. 10 is a cross-sectional view illustrating yet another embodiment of a method of manufacturing the window protective film of FIG. 6 according to principles of the invention.

Referring to FIG. 10, the second release film 4211 may be attached under the adhesive layer 4100 to expose a portion of the adhesive layer 4100. The portion of the adhesive layer 4100 (in an area "B" in FIG. 10) may overlap the auxiliary portion 3320 of the first cell 3300. For example, the second release film 4210 may be replaced due to a decrease in adhesion during the manufacturing process of the window protective film WPF1. That is, when removing the existing second release film 4210 from the adhesive layer 4100 and attaching the new second release film 4211, the second release film 4211 may be attached on a lower surface of the adhesive layer 4100 to expose the portion of the adhesive layer 4100. Next, the window protective film WPF1 of FIG. 6 may be formed by removing the portion of the adhesive layer 4100 overlapping the auxiliary portion 3320 of the first cell 3300.

Figure 11:
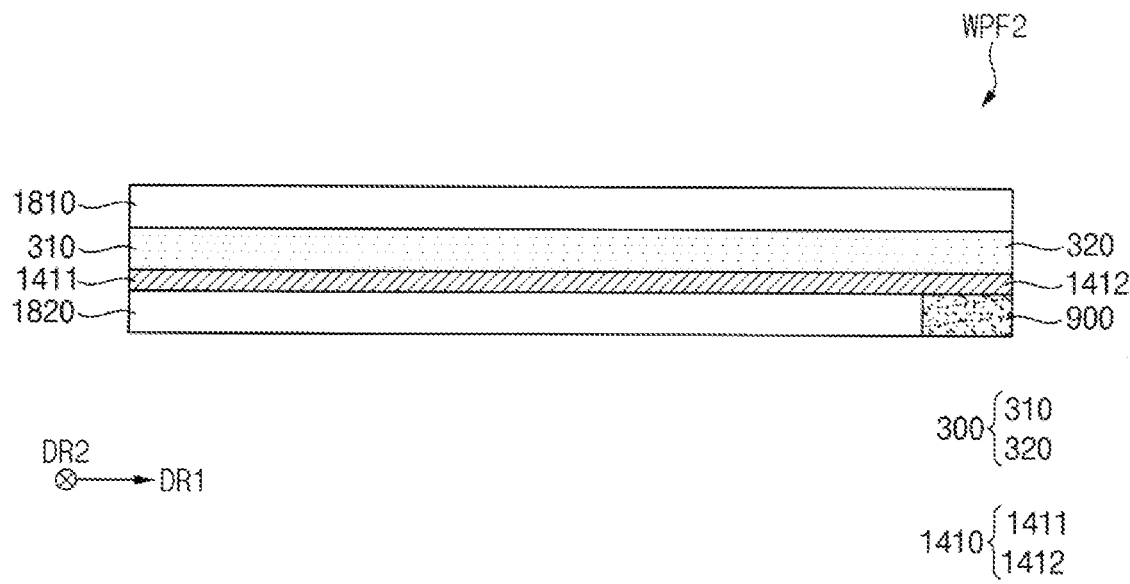
FIG. 11 is a cross-sectional view of another embodiment of a window protective film constructed according to principles of the invention.

FIG. 11 is a cross-sectional view of another embodiment of a window protective film constructed according to principles of the invention.

Referring to FIG. 11, a window protective film WPF2 according to another embodiment may include a window protective layer 300, a first adhesive layer 1410, a first release film 1810, and a second release film 1820.

The window protective film WPF2 may correspond to the display device 11 described with reference to FIG. 5. That is, the window protective layer 300, the first adhesive layer 1410, and the cover member 900 included in the window protective film WPF2 may be substantially the same or similar as the window protective layer 300, the first adhesive layer 1410, and the cover member 900 included in the display device 11, respectively. Therefore, repetitive descriptions will be omitted to avoid redundancy.

The first release film 1810 may be disposed on a first surface of the window protective layer 300. For example, the first surface may be an upper surface of the window protective layer 300. The second release film 1820 and the cover member 900 may be disposed on another surface opposite to the first surface of the window protective layer 300. For example, the other surface may be a lower surface of the window protective layer 300.

The first adhesive layer 1410 may be disposed between the window protective layer 300 and the second release film 1820, and between the window protective layer 300 and the cover member 900. The first adhesive layer 1410 may overlap the main portion 310 and the auxiliary portion 320 of the window protective layer 300. That is, the first adhesive layer 1410 may include a first portion 1411 overlapping the main portion 310 of the window protective layer 300 and a second portion 1412 overlapping the auxiliary portion 320 of the window protective layer 300. The second portion 1412 may be positioned in the first direction DR1 of the first portion 1411.

Each of the second release film 1820 and the cover member 900 may directly contact the first adhesive layer 1410. That is, an upper surface of the second release film 1820 may directly contact a lower surface of the first portion 1411 of the first adhesive layer 1410. An upper surface of the cover member 900 may directly contact a lower surface of the second portion 1412 of the first adhesive layer 1410.

In an embodiment, the first release film 1810 may cover substantially the entire upper surface of the window protective layer 300. The second release film 1820 may cover the lower surface of the first portion 1411 of the first adhesive layer 1410. The cover member 900 may cover the lower surface of the second portion 1412 of the first adhesive layer 1410. That is, the first portion 1411 of the first adhesive layer 1410 may be protected by the second release film 1820, and the second portion 1412 of the second adhesive layer 1412 may be protected by the cover member 900. According to embodiments, the second release film 1820 may continuously cover the lower surface of the first portion 1411 of the first adhesive layer 1410 and the lower surface of the cover member 900.

Figure 12:
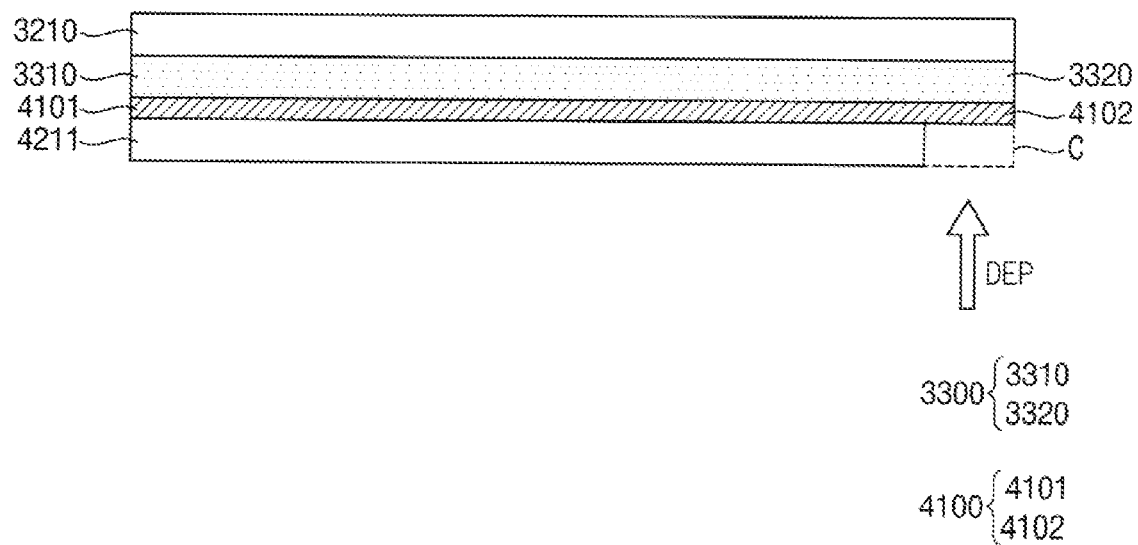
FIG. 12 is a cross-sectional view illustrating another embodiment of a method of manufacturing the window protective film of FIG. 11.

FIG. 12 is a cross-sectional view illustrating another embodiment of a method of manufacturing the window protective film of FIG. 11. A first cell 3300, an adhesive layer 4100, a first release film 3210, and a second release film 4211 illustrated in FIG. 12 may be substantially the same as or similar as the first cell 3300, the adhesive layer 4100, the first release film 3210, and the second release film 4211 described with reference to FIG. 10, respectively. Therefore, repetitive descriptions will be omitted to avoid redundancy.

Referring to FIG. 12, the adhesive layer 4100 may include a first portion 4101 overlapping the main portion 3310 of the first cell 3300 and a second portion 4102 overlapping the auxiliary portion 3320 of the first cell 3300. The second release film 4211 may be attached on a lower surface of the adhesive layer 4100 so that the second release film 4211 overlaps the first portion 4101 of the adhesive layer 4100 and does not overlap the second portion 4102. That is, the second release film 4211 may expose the second portion 4102 of the adhesive layer 4100. For example, the second release film 4210 may be replaced due to a decrease in adhesion during the manufacturing process of the window protective film WPF2. That is, when removing the existing second release film 4210 from the adhesive layer 4100 and attaching the new second release film 4211, the second release film 4211 may be attached on the lower surface of the adhesive layer 4100 to expose a portion of the adhesive layer 4100.

The cover member 900 may be formed in an area C positioned under the second portion 4102 of the adhesive layer 4100. For example, the cover member 900 may be formed so that the cover member 900 does not overlap the second release film 4212. For example, the cover member 900 may be formed using a deposition process (e.g., physical vapor deposition (PVD), chemical vapor deposition (CVD), atomic layer deposition (ALD), or the like).

Figure 13A:
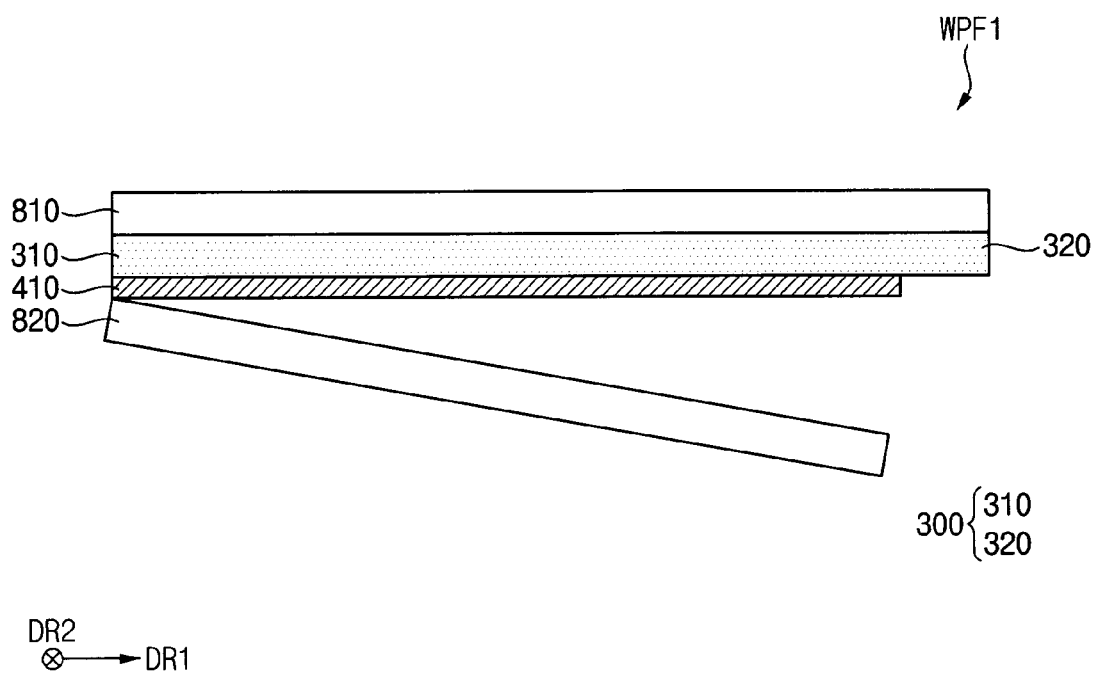

FIGS. 13A and 13B are cross-sectional views illustrating a further embodiment of a method of manufacturing a display device. Elements previously described above may appear in FIGS. 13A and 13B. Repetitive descriptions will be omitted to avoid redundancy.

Referring to FIGS. 13A and 13B, in an embodiment, a method of manufacturing the display device 10 may include the following steps: forming a window 200 on a lower structure 50; preparing a window protective film WPF1; removing a second release film 820 from a window protective layer 300; attaching the window protective film WPF1 on a upper portion of the window 200; and removing a first release film 810 from the window protective layer 300.

The window 200 may be formed on the lower structure 50. The lower structure 50 may include a polarizing layer POL, a third adhesive layer 430, a display panel 100, a panel protective film PPL having a first panel protective film PPL1 and a second panel protective film PPL2, a cushion layer CL, a metal layer ML, and the like. The display panel 100 may include a first area 1A, a second area 2A spaced apart from the first area 1A, and a bending area BA disposed between the first area 1A and the second area 2A. The window 200 may be formed on the lower structure 50 to overlap the first area 1A of the display panel 100.

The window protective film WPF1 may be prepared. The window protective film WPF1 may include the window protective layer 300, the first release film 810 disposed on the window protective layer 300, the second release film 820 disposed under the window protective layer 300, and a first adhesive layer 410 disposed between the window protective layer 300 and the second release film 820. The window protective layer 300 may include a main portion 310 and an auxiliary portion 320 positioned in the first direction DR1 of the main portion 310. In an embodiment, the first adhesive layer 410 may expose the auxiliary portion 320 of the window protective layer 300.

The second release film 820 included in the window protective film WPF1 may be removed. That is, the second release film 820 may be removed from the first adhesive layer 410. A first release force between the first release film 810 and the window protective layer 300 may be greater than a second release force between the second release film 820 and the first adhesive layer 410. Accordingly, when the second release film 820 is removed from the first adhesive layer 410, the first release film 810 may remain attached to the window protective layer 300.

Next, the window protective film WPF1 may be attached to an upper portion of the window 200. The window protective film WPF1 may be attached on the window 200 so that the auxiliary portion 320 of the window protective layer 300 is exposed by the window 200. That is, the first adhesive layer 410 may be attached on the window 200 so that the window 200 exposes the auxiliary portion 320 of the window protective layer 300. For example, the first adhesive layer 410 may be attached on the window 200 so that the auxiliary portion 320 of the window protective layer 300 overlaps the bending area BA of the display panel 100.

Next, the first release film 810 may be removed from the window protective layer 300. The first release film 810 may protect the window protective layer 300 during the manufacturing process of the display device 10. That is, in an embodiment, the display device 10 may be manufactured by forming the window 200 on the lower structure 50 including the display panel 100, and attaching the window protective film WPF1 on the window 200.

In another embodiment, a method of manufacturing the display device 10 may include the following steps: preparing a window protective film WPF1; removing a second release film 820 from a first adhesive layer 410; attaching a window 200 under the first adhesive layer 410 to expose an auxiliary portion 320 of a window protective layer 300; forming a lower structure 50 including a display panel 100 under the window 200; and removing a first release film 810 from the window protective layer 300.

For example, in the manufacturing process of the display device 10, a window module to which the window protective film WPF1 is attached to the window 200 may be formed. That is, the window module may have a structure in which the first adhesive layer 410, the window protective layer 300, and the first release film 810 are sequentially disposed on the window 200. For example, the window module may further include a release film disposed under the window 200. Next, the lower structure 50 may be attached to a lower portion of the window module (i.e., a lower portion of the window 200) to manufacture the display device 10. That is, in another embodiment, the display device 10 may be manufactured by respectively forming the window module including the window protective layer 300 and the window 200 and the lower structure 50 including the display panel 100, and combining the window module and the lower structure 50. For example, the first release film 810 may be removed from the window protective layer 300 after the window module and the lower structure 50 are combined.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a display panel including a first area, a second area spaced apart from the first area, and a bendable area between the first area and the second area;
    a window disposed on the display panel, the window overlapping the first area;
    a protective layer disposed on the window, the protective layer including a first portion overlapping the bendable area; and
    an adhesive disposed between the window and the protective layer.

2. The display device of claim 1, wherein the protective layer has a first length and the window has a second length less than the first length to expose the first portion of the protective layer.

3. The display device of claim 1, wherein the window does not overlap the bendable area.

4. The display device of claim 1, wherein the first portion of the protective layer comprises an auxiliary portion, the protective layer has a first length, and the adhesive has a third length less than the first length to expose the auxiliary portion of the protective layer.

5. The display device of claim 1, wherein the adhesive comprises an adhesive layer that overlaps the first area and does not overlap the bendable area.

6. The display device of claim 1, wherein the adhesive comprises an adhesive layer including a first portion overlapping the window and a second portion overlapping the first portion of the protective layer, and
    the display device further comprises a cover member disposed under the second portion of the adhesive layer.

7. The display device of claim 6, wherein the first portion of the adhesive layer overlaps the first area, and the second portion of the adhesive layer overlaps the bendable area.

8. The display device of claim 6, wherein the adhesive layer has a third length, the window has a fourth length less than the third length to expose the second portion of the adhesive layer.

9. The display device of claim 6, wherein the window contacts a lower surface of the first portion of the adhesive layer, and the cover member contacts a lower surface of the second portion of the adhesive layer.

10. The display device of claim 9, wherein the cover member contacts the window.

11. The display device of claim 6, wherein the cover member comprises an inorganic material.

12. The display device of claim 6, further comprising a bendable protective layer covering the bendable area of the display panel, and
    the cover member is disposed between the adhesive layer and the bendable protective layer.

13. The display device of claim 12, wherein the cover member is not adhered to the bendable protective layer.

14. The display device of claim 1, further comprising a metal layer disposed under the display panel and supporting the display panel, and the display panel and the window are flexible.

15. The display device of claim 1, wherein the window comprises ultra-thin glass that has a thickness of about 100 µm or less.

16. A method of manufacturing a display device, the method comprising the steps of:
    disposing a window on a lower structure including a display panel;
    preparing a protective film including a protective layer having a first portion, a first release film disposed on the protective layer, a second release film disposed under the protective layer, and an adhesive layer disposed between the protective layer and the second release film;
    removing the second release film from the adhesive layer;
    attaching the adhesive layer on the window to expose the first portion of the protective layer; and
    removing the first release film from the protective layer.

17. The method of claim 16, wherein the first portion of the protective layer comprises an auxiliary portion and the adhesive layer exposes the auxiliary portion of the protective layer.

18. The method of claim 16, wherein the adhesive layer comprises a first portion overlapping the window and a second portion overlapping the first portion of the protective layer, and
    the protective film further comprises a cover member disposed under the second portion of the adhesive layer.

19. The method of claim 16, wherein the display panel comprises a first area, a second area spaced apart from the first area, and a bendable area between the first area and the second area,
    wherein the window is disposed on the lower structure overlapping the first area, and the adhesive layer is attached on the window so that the first portion of the protective layer overlaps the bendable area.

20. A method of manufacturing a display device, the method comprising the steps of:
    preparing a protective film including a protective layer including an auxiliary portion, a first release film on the protective layer, a second release film under the protective layer, and an adhesive between the protective layer and the second release film;
    removing the second release film from the adhesive;
    attaching a window under the adhesive to expose the auxiliary portion of the protective layer;
    forming a lower structure including a display panel under the window; and
    removing the first release film from the protective layer.

* * * * *